(12) United States Patent
Lee et al.

(10) Patent No.: US 11,527,470 B2
(45) Date of Patent: Dec. 13, 2022

(54) FILM PACKAGE AND METHOD OF FABRICATING PACKAGE MODULE

(71) Applicant: SAMSUNG ELECTRONICS CO., LTD., Suwon-si (KR)

(72) Inventors: Shle-Ge Lee, Seoul (KR); Youngbae Kim, Seoul (KR); Ji-Yong Park, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 137 days.

(21) Appl. No.: 16/872,567

(22) Filed: May 12, 2020

(65) Prior Publication Data

US 2021/0104452 A1 Apr. 8, 2021

(30) Foreign Application Priority Data

Oct. 4, 2019 (KR) ........................ 10-2019-0122873

(51) Int. Cl.
*H01L 23/49* (2006.01)
*H01L 23/498* (2006.01)
(Continued)

(52) U.S. Cl.
CPC ...... *H01L 23/4985* (2013.01); *H01L 23/3157* (2013.01); *H01L 29/76808* (2013.01); *H05K 1/111* (2013.01); *H05K 2201/09418* (2013.01)

(58) Field of Classification Search
CPC ............ H01L 23/4985; H01L 23/3157; H01L 29/76808; H01L 23/49838; H01L 23/49572; H01L 21/68; H01L 23/12; H01L 24/06; H01L 25/0655; H05K 1/111; H05K 2201/09418; H05K 1/118; H05K 3/361; H05K 1/147; H05K 2201/0154; H05K 2201/10128; H05K 2201/10136
See application file for complete search history.

(56) References Cited

U.S. PATENT DOCUMENTS 7,548,296 B2 6/2009 Hong et al.
7,630,048 B2 12/2009 Hong et al.
(Continued)

FOREIGN PATENT DOCUMENTS

JP 2003-249527 A 9/2003
JP 2007-242941 A 9/2007
(Continued)

*Primary Examiner* — S M Sohel Imtiaz
(74) *Attorney, Agent, or Firm* — Myers Bigel, P.A.

(57) ABSTRACT

Disclosed are film packages and methods of fabricating package modules. The film package includes a film substrate that includes a chip region and a peripheral region facing each other in a first direction, a plurality of output pads that are arranged in the first direction on the chip region and on the peripheral region, and a semiconductor chip on the chip region and electrically connected to the output pads. The output pads on the chip region are arranged at regular first intervals along the first direction. The output pads include a plurality of first output pads that are arranged at a first pitch along the first direction on the chip region and a plurality of second output pads on the peripheral region. The second output pads are arranged at a second pitch greater than the first pitch of the first output pads.

19 Claims, 11 Drawing Sheets

(51) Int. Cl.
  *H05K 1/11* (2006.01)
  *H01L 23/31* (2006.01)
  *H01L 29/768* (2006.01)

(56) References Cited

U.S. PATENT DOCUMENTS

| | | | |
|---|---|---|---|
| 8,305,541 | B2 | 11/2012 | Hwang |
| 9,167,687 | B2 | 10/2015 | Tan et al. |
| 9,761,560 | B2 | 9/2017 | Lee et al. |
| 9,905,631 | B2 | 2/2018 | Yoon et al. |
| 9,960,151 | B2* | 5/2018 | Chang .................. H01L 25/167 |
| 10,034,367 | B2 | 7/2018 | Park et al. |
| 10,747,038 | B2* | 8/2020 | Seo .................. G02F 1/133345 |
| 2008/0055291 | A1* | 3/2008 | Hwang .................. H05K 3/361 |
| | | | 345/204 |
| 2015/0230331 | A1* | 8/2015 | Lee ...................... H05K 1/0259 |
| | | | 361/220 |
| 2015/0311148 | A1* | 10/2015 | Jung ................. H01L 23/49838 |
| | | | 361/767 |
| 2017/0170164 | A1* | 6/2017 | Yip ....................... H01L 23/373 |
| 2017/0372992 | A1* | 12/2017 | Chung .............. H01L 23/49838 |
| 2018/0158750 | A1* | 6/2018 | Kim ........................ H01L 24/73 |
| 2019/0011760 | A1* | 1/2019 | Wang .................... G02F 1/1333 |

FOREIGN PATENT DOCUMENTS

| | | |
|---|---|---|
| JP | 2008-286980 A | 11/2008 |
| JP | 2010-177493 A | 8/2010 |
| JP | 2012-15469 A | 1/2012 |
| KR | 10-2008-0001330 A | 1/2008 |

\* cited by examiner

FILM PACKAGE AND METHOD OF FABRICATING PACKAGE MODULE

CROSS-REFERENCE TO RELATED APPLICATION

This U.S. nonprovisional application claims priority under 35 U.S.C § 119 to Korean Patent Application No. 10-2019-0122873 filed on Oct. 4, 2019, in the Korean Intellectual Property Office, the disclosures of which are hereby incorporated by reference in their entirety.

BACKGROUND

The present inventive concepts relate to a semiconductor package, and more particularly, to a film package and a method of fabricating a package module using the same.

A chip-on-film (COF) package technique has been developed to use a flexible film substrate in order to cope with recent trend toward smaller, thinner, and lighter electronic products. According to the COF package technique, a semiconductor chip may be directly flip-chip bonded to a film substrate and coupled through a short lead to an external circuit. The COF package may be applied to portable terminal devices such as a cellular phone, a personal digital assistant (PDA), laptop computers, or display panels.

SUMMARY

Some example embodiments of the present inventive concepts provide a film package in which a pad misalignment is prevented or reduced and reliability is improved.

Some example embodiments of the present inventive concepts provide a method of fabricating a package module, which method prevents or reduces a pad misalignment and improves reliability.

According to some example embodiments of the present inventive concepts, a film package may include a film substrate that includes a chip region and a peripheral region facing each other in a first direction, a plurality of output pads that are spaced apart from each other in the first direction on the chip region and on the peripheral region, and a semiconductor chip on the chip region and electrically connected to the output pads. The output pads on the chip region are at regular intervals along the first direction. The output pads may include a plurality of first output pads that are at a first pitch along the first direction on the chip region, and a plurality of second output pads on the peripheral region. The second output pads are at a second pitch that is greater than the first pitch of the first output pads.

According to some example embodiments of the present inventive concepts, a film package may include a film substrate that includes first and second chip regions and a peripheral region between the first and second chip regions. The first and second chip regions are spaced apart from each other in a first direction. The film package may include a plurality of output pads that are spaced apart from each other in the first direction on the film substrate, a first semiconductor chip on the first chip region and electrically connected to at least one of the output pads, and a second semiconductor chip on the second chip region and electrically connected to at least one of the output pads. The output pads may include a plurality of first output pads on the first chip region, a plurality of second output pads on the second chip region, and a plurality of third output pads on the peripheral region. The third output pads may be at a third pitch greater than a first pitch of the first output pads and greater than a second pitch of the second output pads.

According to some example embodiments of the present inventive concepts, a package module includes a display device, a film substrate including a chip region and a peripheral region adjacent each other, a first plurality of output pads on the chip region that are spaced apart at first intervals, a second plurality of output pads on the peripheral region that are spaced apart at second intervals different from the first intervals, and a semiconductor chip on the chip region that is electrically connected to the first plurality of output pads and the second plurality of output pads. The film substrate includes a first material and the display device comprises a substrate includes a second material. A first thermal expansion coefficient of the first material is greater than a second thermal expansion coefficient of the second material.

DETAILED DESCRIPTION

The following will now describe a package module according to some example embodiments of the present inventive concepts in junction with the accompanying drawings.

Figure 1:
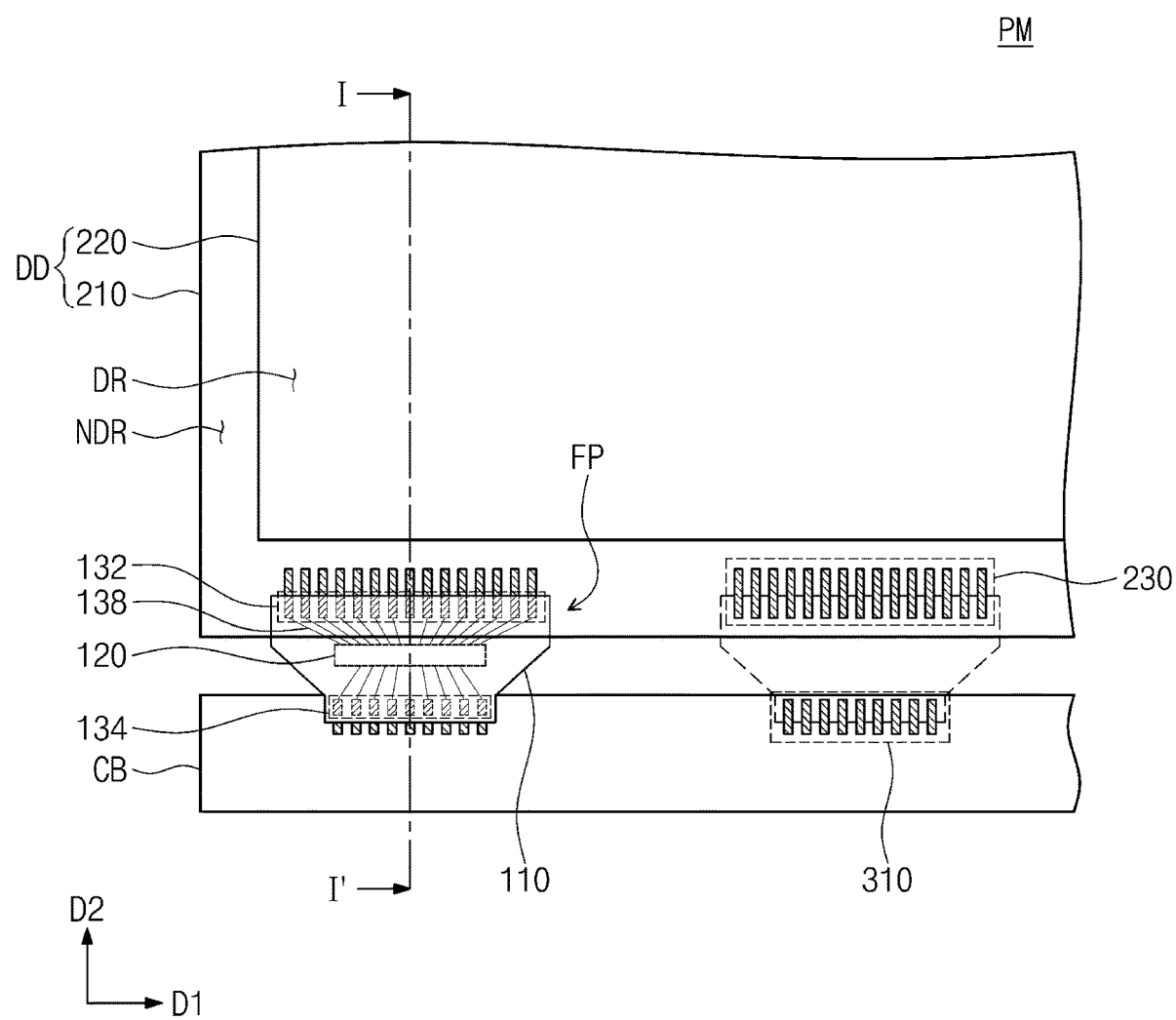
FIG. 1 illustrates a plan view partially showing a package module, according to some example embodiments of the present inventive concepts.
Figure 2:
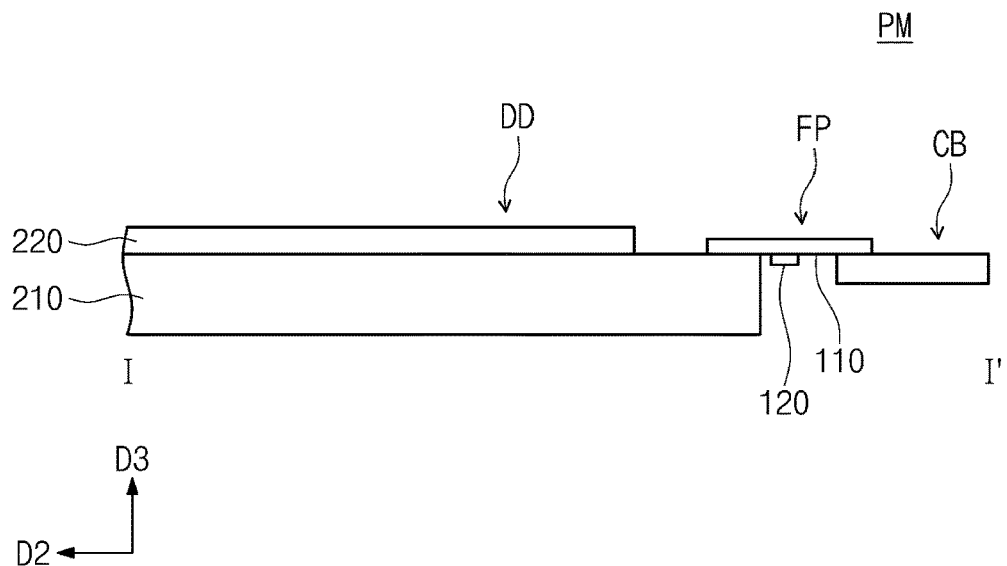
FIG. 2 illustrates a cross-sectional view taken along line I-I' of FIG. 1.
Figure 3:
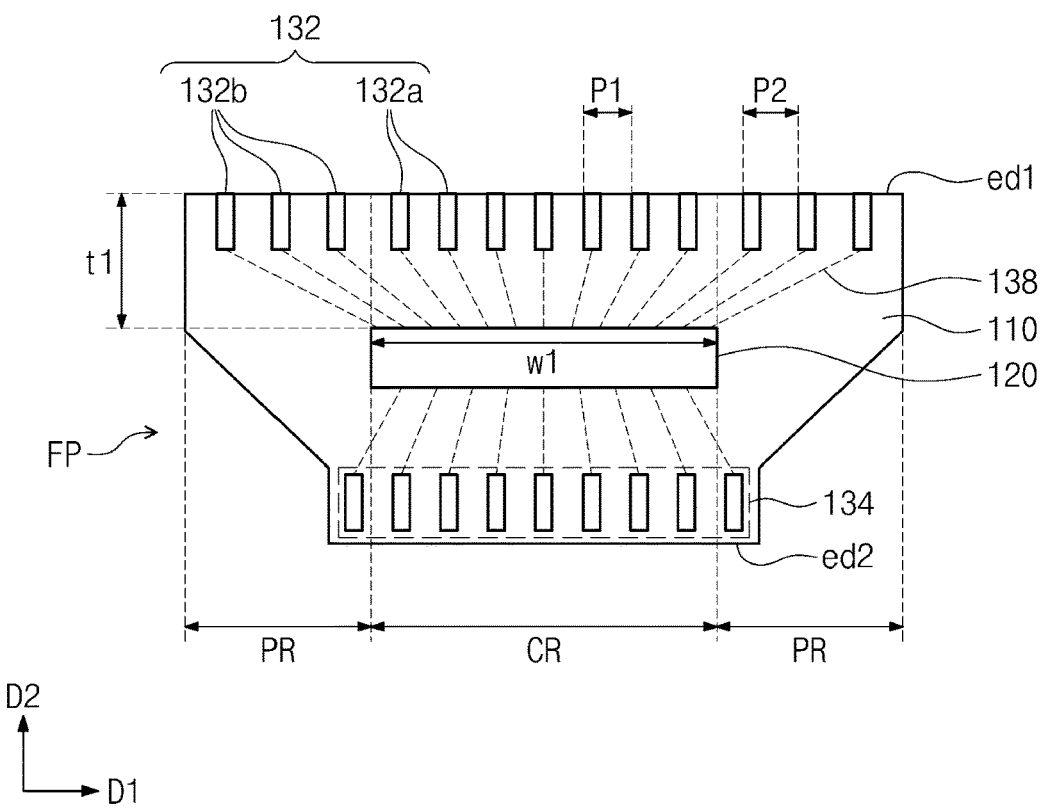
FIG. 3 illustrates a plan view showing a film package, according to some example embodiments of the present inventive concepts.

FIG. 1 illustrates a plan view partially showing a package module, according to some example embodiments of the present inventive concepts. FIG. 2 illustrates a cross-sectional view taken along line I-I of FIG. 1. FIG. 3 illustrates a plan view showing a film package, according to some example embodiments of the present inventive concepts.

Referring to FIGS. 1 and 2, a package module PM may include a display device DD, a circuit board CB, and a film package FP. The film package FP may be disposed between and electrically connect the display device DD and the circuit board CB.

The film package FP may include a film substrate 110, a semiconductor chip 120, output pads 132, and input pads 134. The film substrate 110 may be provided with the output pads 132 and the input pads 134 on its surface that faces the display device DD and the circuit board CB. The film package FP may receive signals output from the circuit board CB and may transmit the signals to the display device DD.

The semiconductor chip 120 may include a driver IC that drives the display device DD. The semiconductor chip 120 may be mounted on the same surface on which the output pads 132 and the input pads 134 are provided. The semiconductor chip 120 may be electrically connected through connection patterns 138 to the output pads 132 and the input pads 134. An under-fill material (not shown) may fill a space between the semiconductor chip 120 and the film substrate 110.

The film package FP may include a first edge (see ed1 of FIG. 3) adjacent to the display device DD and a second edge (see ed2 of FIG. 3) adjacent to the circuit board CB. The output pads 132 may be provided close to the first edge ed1 and coupled to the display device DD. The input pads 134 may be disposed adjacent to the second edge ed2 and electrically connected to the circuit board CB.

The display device DD may be provided on one side of the film package FP. The display device DD may include a first substrate 210 and a second substrate 220 on the first substrate 210. A display region DR may be formed between the first substrate 210 and the second substrate 220. In some embodiments, the display region DR may include a switching element that is turned on or off in response to a control signal received from the circuit board CB and a light emitting element that emits light under control of the switching element. The light emitting element may receive the control signal through data lines and scan lines arranged in a matrix shape on the display region DR. The display device DD may be, for example, a liquid crystal display (LCD) panel, a light emitting diode (LED) panel, an organic LED panel, or a plasma display panel (PDP).

The first substrate 210 of the display device DD may have an area greater than that of the second substrate 220 of the display device DD. The first substrate 210 may include a non-display region NDR, on which no image is displayed, on its portion that does not overlap the second substrate 220. Panel pads 230 may be provided on the non-display region NDR. The panel pads 230 may be electrically connected to the data lines and the scan lines on the display region DR. The panel pads 230 may be coupled to the output pads 132 formed on the first edge ed1 of the film package FP. The panel pads 230 may be adjacent to each other in a first direction D1, thereby constituting a pad group. For example, as shown in FIG. 1, a plurality of pad groups may be spaced apart from each other in the first direction D1. The film package FP may be coupled to one pad group. For example, the pad group of the display device DD may be a collection of the panel pads 230 that correspond to the output pads 132 included in one film package FP. In some embodiments, the panel pads 230 constituting one pad group may be arranged at a regular pitch. The term "pad pitch" may refer to a minimum length of repeated pad patterns. In some embodiments, the panel pads 230 constituting one pad group may be arranged at an irregular interval. In other words, the pad pitch between different pads may be different from one another.

The circuit board CB may be provided on another side of the film package FP. The circuit board CB may supply the display device DD with data signals or gate signals through the film package FP. Circuit pads 310 may be provided on one side of the circuit board CB. The circuit pads 310 may be coupled to the input pads 134 of the film package FP.

The film package FP may be formed separately from and coupled to the display device DD and the circuit board CB. For example, a thermal compression process may be employed to couple the film package FP to the display device DD, and an interval between the output pads 132 of the film package FP may be changed as a coupling process is performed. The coupling process of the film package FP will be further discussed in detail below with reference to FIGS. 6 and 7.

Referring to FIG. 3, the following will describe the film package FP before the coupling process is performed. The film substrate 110 of the film package FP may include, for example, polyimide or polyester. The film substrate 110 may be flexible. The first edge ed1 of the film substrate 110 may have a length in the first direction D1 greater than a length in the first direction D1 of the second edge ed2 of the film substrate 110. The lengths in the first direction D1 of the first and second edges ed1 and ed2 may be greater than a width w1 in the first direction D1 of the semiconductor chip 120. The film substrate 110 may include a tapered region on a central portion thereof. The tapered region may have a width in the first direction D1 that decreases with increasing distance from the first edge ed1. The film substrate 110 may have the same length in a second direction D2 at its chip and peripheral regions CR and PR which will be discussed below.

The film substrate 110 may include a plurality of peripheral regions PR spaced apart from each other in the first direction D1, and also include a chip region CR between the peripheral regions PR. The semiconductor chip 120 may be disposed on the chip region CR, but not on the peripheral regions PR. The chip and peripheral regions CR and PR may be defined by lateral surfaces of the semiconductor chip 120 that face each other in the first direction D1. The chip region CR may have a length in the first direction D1 the same as the width w1 in the first direction D1 of the semiconductor chip 120.

The output pads 132 and the input pads 134 may be disposed on the chip region CR and/or the peripheral regions PR. The output pads 132 may be disposed adjacent to the first edge ed1, and the input pads 134 may be disposed adjacent to the second edge ed2. The output pads 132 may be arranged along the first direction D1, and the input pads 134 may also be arranged along the first direction D1. Each of the output and input pads 132 and 134 may have a rectangular shape elongated in the second direction D2. The output and input pads 132 and 134 may include conductive patterns. The output pads 132 may correspond to the panel pads 230 of the display device DD discussed with reference to FIG. 1.

The output pads 132 on the chip region CR may be defined as first pads 132a, and the output pads 132 on the peripheral regions PR may be defined as second pads 132b. The first pads 132a may overlap in the second direction D1 with the semiconductor chip 120. The second pads 132b may be spaced apart in the first direction D1 from the semiconductor chip 120. The first pads 132a may be arranged at a first pitch P1, and the second pads 132b may be arranged at a second pitch P2 greater than the first pitch P1. Because the second pads 132b are arranged at a pitch greater than that of the first pads 132a, it may be possible to prevent a pad misalignment due to a difference in shrink factor at each region during the coupling process for the film package FP. Each of the chip and peripheral regions CR and PR may have a uniform shrink factor. The shrink factor of the chip region CR may be different from that of the peripheral region PR. The differences in the shrink factors of the chip region CR and the peripheral region PR may be due to differences in materials used in these regions and/or due to the differences in pitch. The output pads 132 on the chip region CR may all be arranged at a regular interval. The output pads 132 on the peripheral region PR may all be arranged at a regular interval. For example, the first pads 132a may be arranged at a first regular pitch (e.g., the first pitch P1), and the second pads 132b may be arranged at a second regular pitch (e.g., the second pitch P2).

The width w1 in the first direction D1 of the semiconductor chip 120 may be greater than a width in the second direction D2 of the semiconductor chip 120. When viewed in plan, the semiconductor chip 120 may have a rectangular shape that extends in the first direction D1. A distance t1 between the semiconductor chip 120 and the first edge ed1 may be less than half the width w1 in the first direction D1 of the semiconductor chip 120.

The connection patterns 138 may electrically connect the output and input pads 132 and 134 to the semiconductor chip 120. As shown in FIG. 1, the semiconductor chip 120 may be electrically connected to the panel pads 230 of the display device DD through the output pads 132 and the connection patterns 138, and also connected to the circuit pads 310 of the circuit board CB through the input pads 134 and the connection patterns 138.

The following will discuss a method of fabricating a package module according to some example embodiments of the present inventive concepts in conjunction with following drawings. In addition, the following will describe in detail a film package according to some example embodiments of the present inventive concepts.

Figure 4:
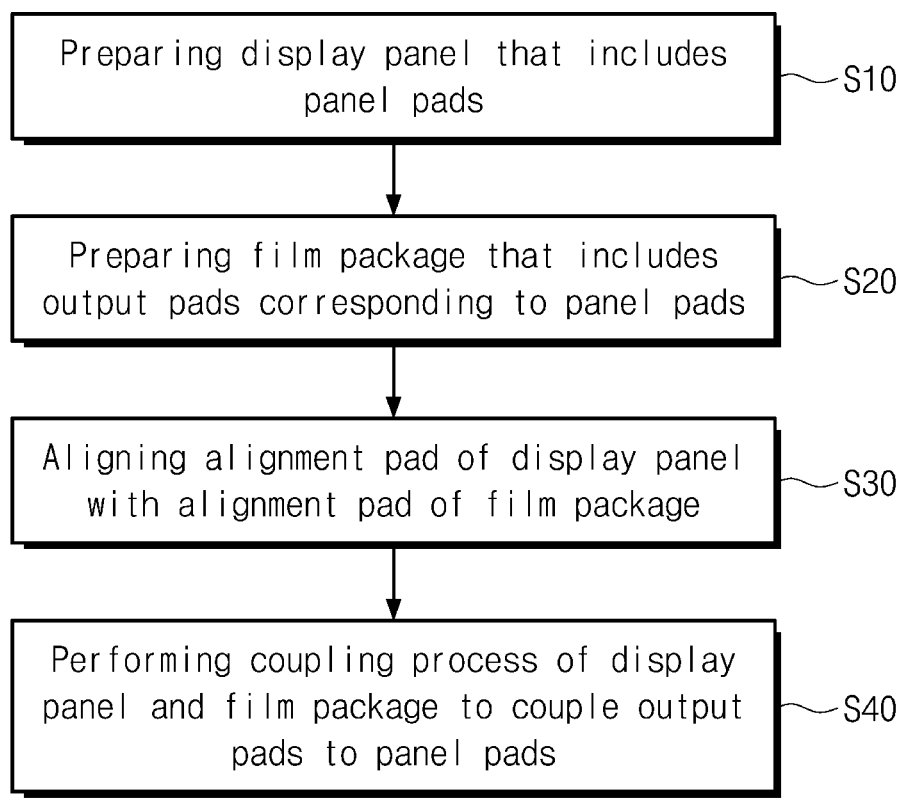
FIG. 4 illustrates a flow chart showing a method of fabricating a package module, according to some example embodiments of the present inventive concepts.
Figure 5:
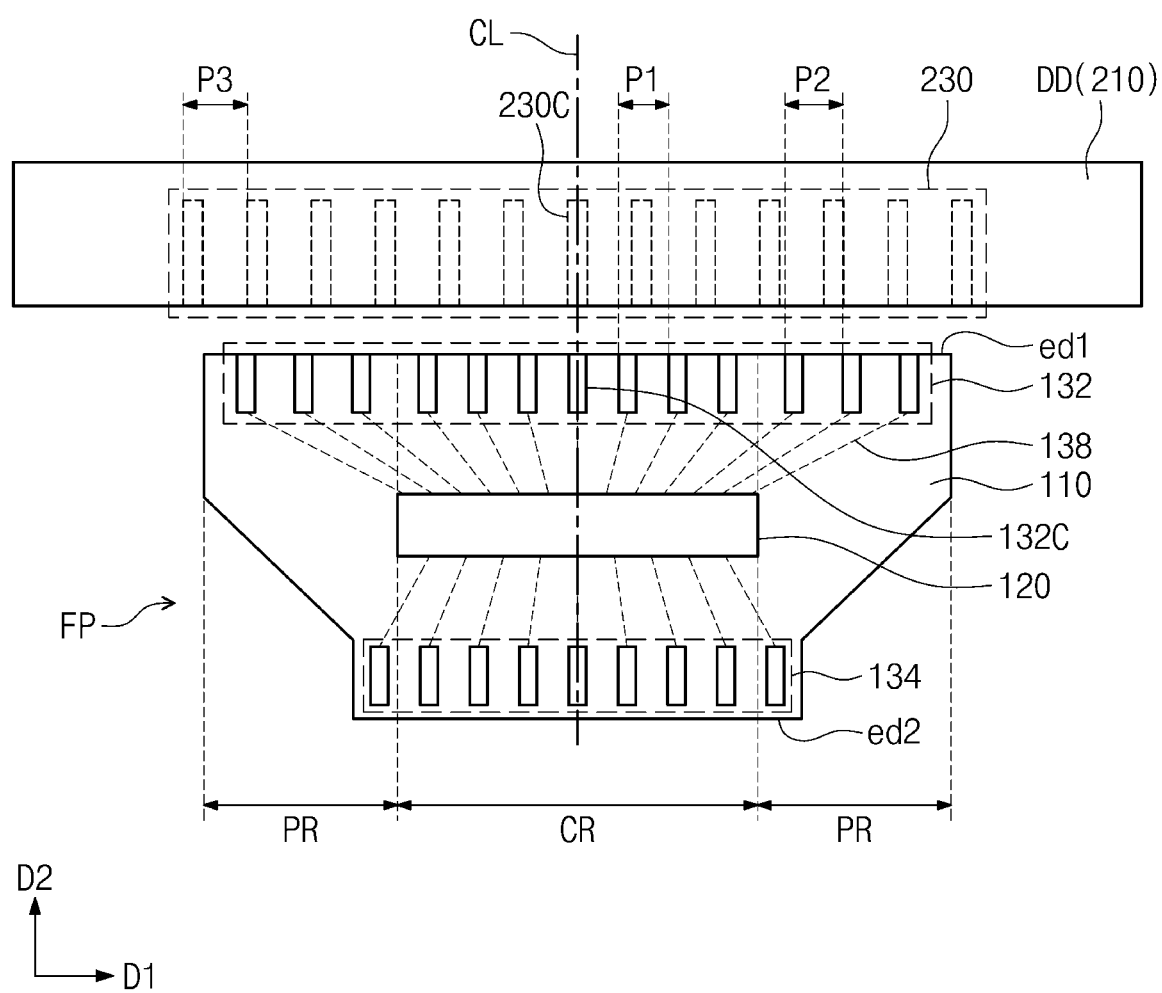
FIGS. 5 to 7 illustrate plan views showing a method of fabricating a package module, according to some example embodiments of the present inventive concepts.
Figure 6:
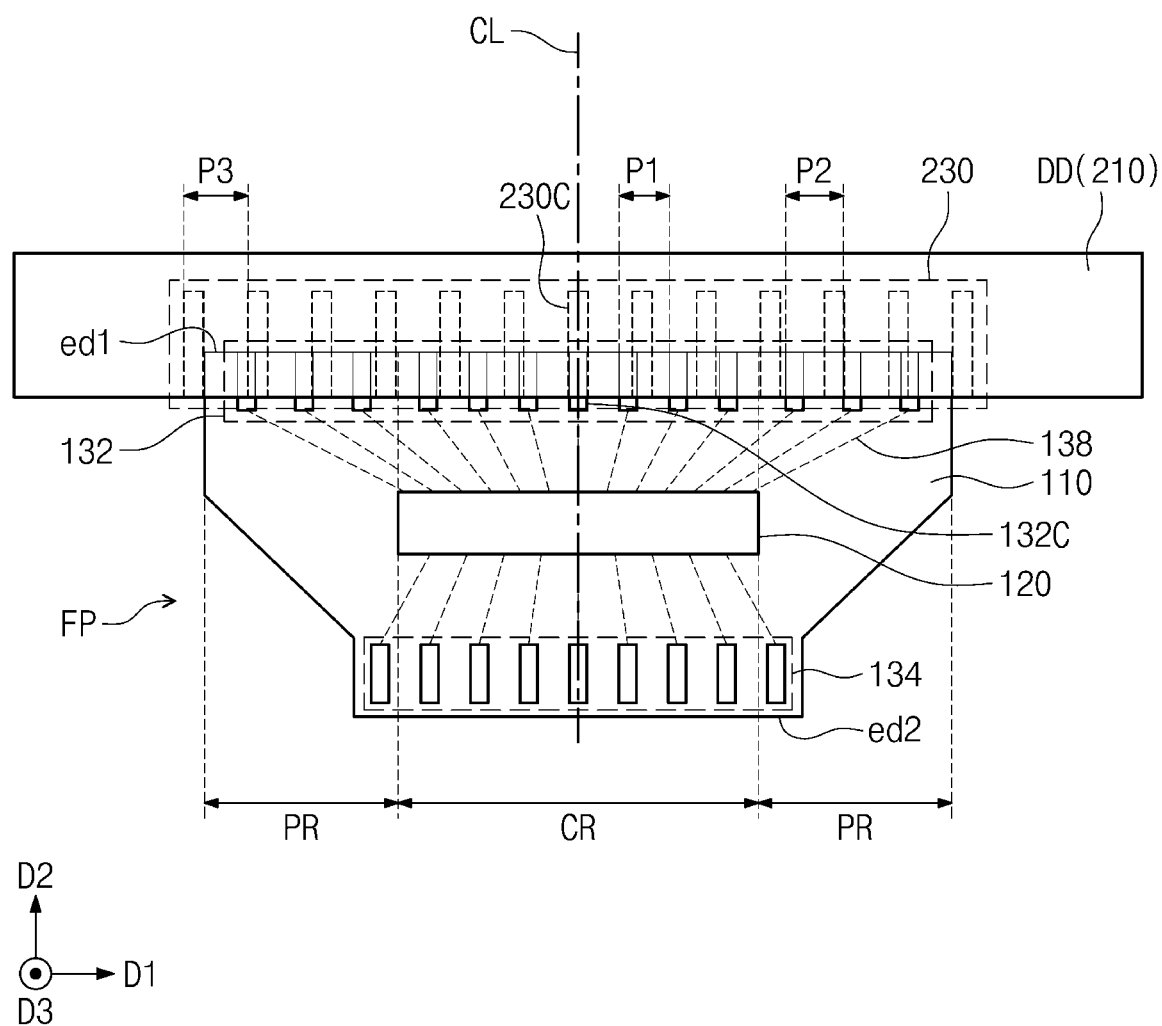
Figure 7:
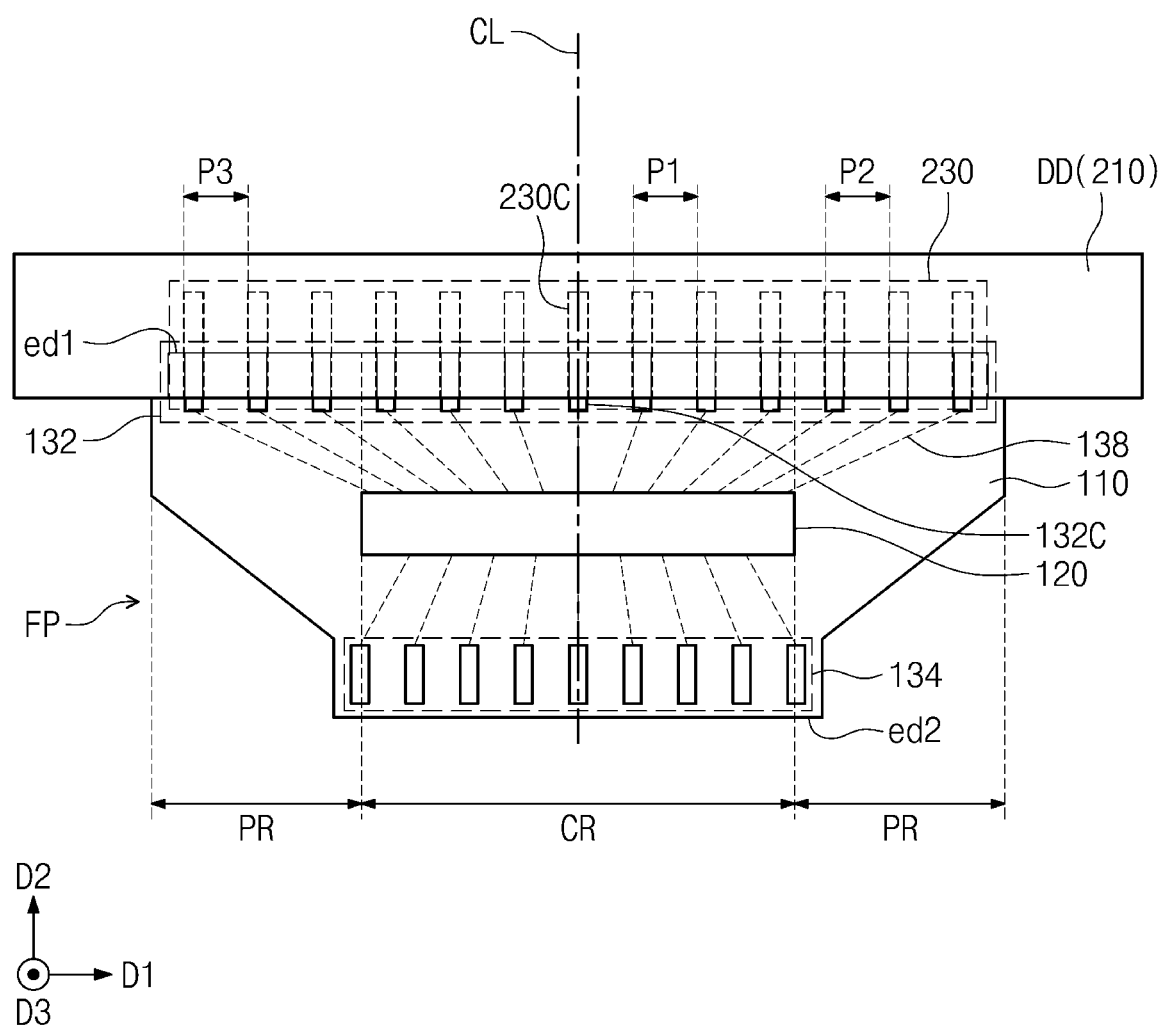

FIG. 4 illustrates a flow chart showing a method of fabricating a package module, according to some example embodiments of the present inventive concepts. FIGS. 5 to 7 illustrate plan views showing a method of fabricating a package module, according to some example embodiments of the present inventive concepts.

Referring to FIGS. 4 and 5, a display device DD that includes panel pads 230 may be prepared (S10). The panel pads 230 of the display device DD may be arranged along a first direction D1. The panel pads 230 may have a third pitch P3 different from first and second pitches P1 and P2 which will be discussed below. The panel pads 230 may be arranged at a regular pitch, but the present inventive concepts are not limited thereto. Differently from that shown in FIG. 5, the panel pads 230 may be arranged at a pitch that is changed depending on an area where the panel pads 230 are disposed. The panel pads 230 may have a pitch that is irregular in accordance with a panel design of the display device DD. For simplicity of description, the following will explain some embodiments where the panel pads 230 have a regular pitch. The present inventive concepts, however, are not limited to the embodiment where the panel pads 230 have a regular pitch. Other embodiments, which include the panel pads 230 arranged at an irregular pitch, will be explained with reference to FIGS. 10A and 10B.

The panel pads 230 of the display device DD may be adjacent to each other in the first direction D1, thereby constituting a pad group. The number of the panel pads 230 included in the pad group may be the same number as that of output pads 132 in a film package FP which will be discussed below. The display device DD may include a first alignment pad 230C. The first alignment pad 230C may run across a center in the first direction D1 of the pad group, and may be located on a central line CL that extends in a second direction D2 intersecting the first direction D1. The central line CL may intersect the first direction D1 at approximately 90°. In some embodiments, the display device DD may have the same number of panel pads 230 on each of its sides that face each other in the first direction D1 across the first alignment pad 230C.

Referring back to FIGS. 4 and 5, a film package FP may be prepared which includes output pads 132 corresponding to the panel pads 230 (S20). The preparation step S20 of the film package FP may include designing a pad layout of the film package FP that corresponds to a pad layout of the display device DD, in consideration of a shrink factor at each region of the film package FP.

In some embodiments, a film substrate 110 of the film package FP may include a material whose thermal expansion coefficient is greater than that of a material that constitutes the display device DD (or a first substrate 210). For example, the first substrate 210 may include a glass, and the film substrate 110 may include a material having a thermal expansion coefficient greater than that of the glass. Compared to the first substrate 210, the film substrate 110 may easily expand due to heat and pressure in a subsequent coupling process step S40. Therefore, the film substrate 110 may be designed smaller than that during expansion to avoid expansion-induced misalignments between the panel pads 230 and the output pads 132 in the subsequent coupling process step S40.

A shrink factor may be defined to refer to a difference in size ratio of the film substrate 110 before expansion to the film substrate 110 after expansion. For example, when the film substrate 110 before expansion has a size corresponding to 99.6% of that of the film substrate 110 after expansion, the shrink factor may be 0.4%. According to some embodiments of the present inventive concepts, a shrink factor assigned to a chip region CR of the film substrate 110 may be greater than that assigned to a peripheral region PR of the film substrate 110, thereby designing a pad layout. For example, when the panel pads 230 are arranged at the same interval on the display device DD, the output pads 132 corresponding to the panel pads 230 may be designed to have a smaller pitch on the chip region CR than on the peripheral region PR.

The output pads 132 may have a first pitch P1 on the chip region CR and a second pitch P2 on the peripheral region PR. The first pitch P1 and the second pitch P2 may be less than the third pitch P3. When the third pitch P3 of the panel pads 230 has a uniform value, the first and second pitches P1 and P2 of the output pads 132 may each have a uniform value. The first pitch P1 may be less than the second pitch P2. The number of the output pads 132 may be the same as that of the panel pads 230 included in the pad group on the display device DD. The output pads 132 may have a one-to-one correspondence with the panel pads 230. In addition, the output pads 132 may be configured to have the same pitch as the third pitch P2 during expansion caused by the subsequent coupling process step S40.

The output pads 132 may include a second alignment pad 132C. The second alignment pad 132C may run across a center in the first direction D1 of the film substrate 110, and may be located on a central line CL that extends in the second direction D2 intersecting the first direction D1. In some embodiments, the film substrate 110 may have the same number of output pads 132 on each of its sides that face each other in the first direction D1 across the second alignment pad 132C Referring to FIGS. 4 and 6, the first alignment pad 230C of the display device DD may be aligned with the second alignment pad 132C of the film package FP. The first alignment pad 230C may vertically overlap the second alignment pad 132C. The first alignment pad 230C and the second alignment pad 132C may be disposed to face each other in a third direction D3. The display device DD and the film package FP may have therebetween an adhesive layer (not shown) or a conductive film (not shown), which have been omitted from FIGS. 4 and 6. Except for the alignment pads 230C and 132C, the output pads 132 and the panel pads 230 may be disposed offset from each other based on a difference between the third pitch P3 and the first and second pitches P1 and P2.

Referring to FIGS. 4, 6, and 7, a coupling process of the display device DD and the film package FP may be performed to couple the output pads 132 to the panel pads 230 (S40). According to some embodiments, the coupling process may include a heating process and a thermal compression process.

For example, as shown in FIG. 6, the heating process may be performed on the film package FP under the state where the first and second alignment pads 230C and 132C are aligned with each other. Although not shown, a heating stamp or the like may be used to perform the heating process at 165° C. to 175° C. The heating process may increase the first and second pitches P1 and P2 of the output pads 132. The heating process may also increase the third pitch P3 of the panel pads 230. A rate of increase in the third pitch P3 caused by the heating process may be much less (e.g., at least ten times less) than a rate of increase in the first and second pitches P1 and P2 caused by the heating process.

Afterwards, the thermal compression process may be performed. The thermal compression process may be executed at, for example, 165° C. to 175° C. While the thermal compression process is performed, the output pads 132 of the film package FP may be aligned with the panel pads 230 of the display device DD. For example, as shown in FIG. 7, when the panel pads 230 are regularly arranged at the third pitch P3, the first and second pitches P1 and P2 may become identical to the third pitch P3. Because the shrink factor assigned to the chip region CR is greater than the shrink factor assigned to the peripheral region PR, a variation in the first pitch P1 may be greater than a variation in the second pitch P2. The heated display device DD and the heated film package FP may be cooled, and thus the coupling process thereof may be completed. When the coupling process is completed, the output pads 132 of the film package FP may overlap vertically (e.g., in the third direction D3) with the panel pads 230 of the display device DD, such that the output pads 132 may one-to-one matched and/or aligned with the panel pads 230.

Referring back to FIGS. 1 and 2, a coupling process may be performed to combine the film package FP with a circuit board CB. During the coupling process of the circuit board CB and the film package FP, the input pads 134 of the film package FP may be coupled to circuit pads 310 of the circuit board CB. In some embodiments, the coupling process of the circuit board CB and the film package FP may be preceded by the coupling process of the film package FP and the display device DD. In other embodiments, the coupling process of the circuit board CB and the film package FP may be followed by the coupling process of the film package FP and the display device DD.

Figure 8:
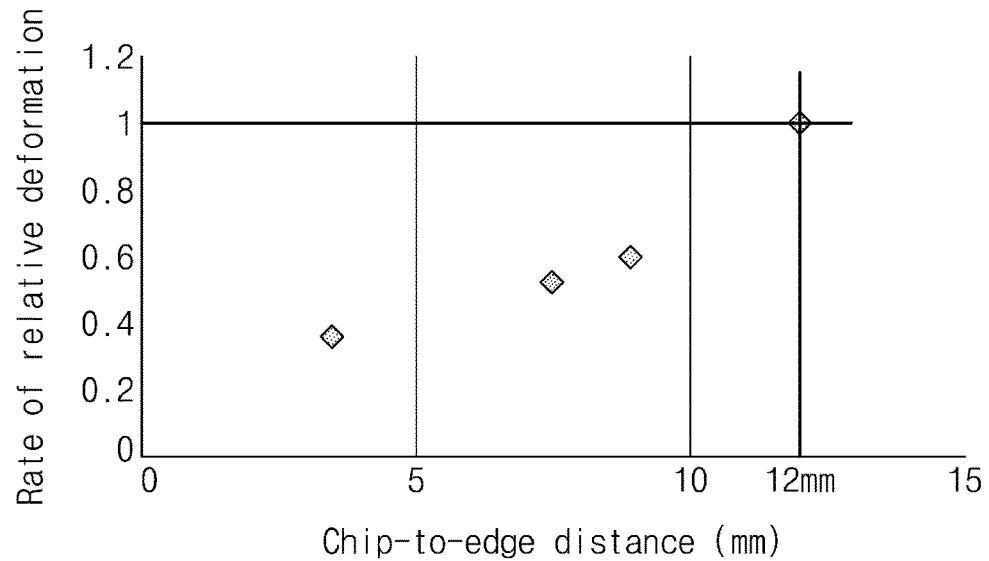
FIG. 8 illustrates a graph showing a rate of relative deformation in chip and peripheral regions varying with a distance between a semiconductor chip and a first edge.

FIG. 8 illustrates a graph showing a rate of relative deformation in chip and peripheral regions varying with a distance between a semiconductor chip and a first edge.

EXPERIMENTAL EXAMPLE 1

The film package FP was formed by providing the film substrate 110 with the semiconductor chip 120 whose width in the first direction D1 is 24 nm. The film package FP was compressed at a temperature range of 165° C. to 175° C. similar to that in the coupling process of the film package FP, and then calculation was made to obtain a rate of relative deformation in the chip region CR and the peripheral region PR. FIG. 8 shows results of the rate of relative deformation repeatedly measured while changing a distance t1 between the semiconductor chip 120 and the first edge ed1.

Referring to FIG. 8, it may be found that the distance t1 between the semiconductor chip 120 and the first edge ed1 influences the rate of relative deformation in the chip region CR and the peripheral region PR. In addition, when the distance t1 between the semiconductor chip 120 and the first edge ed1 is greater than half a length in the first direction D1 of the semiconductor chip 120, it may be ascertained that the rate of relative deformation in the chip region CR and the peripheral region PR is the same. According to some embodiments of the present inventive concepts, the distance t1 between the semiconductor chip 120 and the first edge ed1 may be less than half the length in the first direction D1 of the semiconductor chip 120.

The rate of relative deformation in the chip region CR and the peripheral region PR may be changed based on the distance t1 between the semiconductor chip 120 and the first edge ed1. Therefore, in designing the film package FP, pad layouts of the chip region CR and the peripheral region PR may be designed in consideration of the distance t1 between the semiconductor chip 120 and the first edge ed1. For example, when the distance t1 between the semiconductor chip 120 and the first edge ed1 is less than half the length in the first direction D1 of the semiconductor chip 120, the chip region CR may be designed to have a pad pitch less than that of the peripheral region PR. Accordingly, it may be possible to prevent a pad misalignment caused by deformation of the film substrate 110, since the deformation occurs depending on mount positions of the semiconductor chip 120 on the film package FP.

Figure 9:
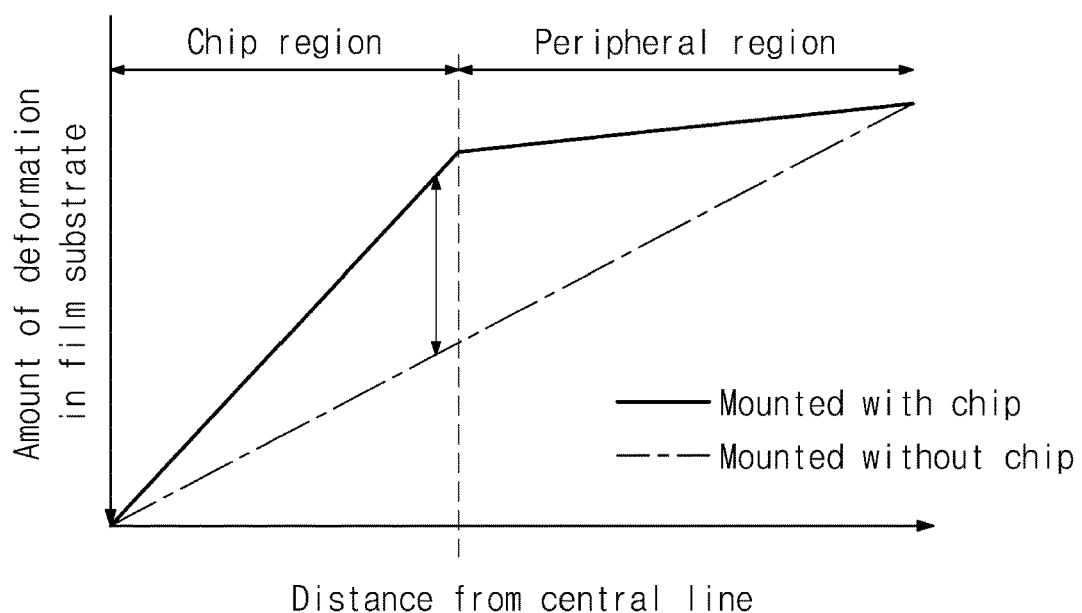
FIG. 9 illustrates a graph showing an amount of thermal deformation in a film substrate varying with a distance from a central line of a film package.

FIG. 9 illustrates a graph showing an amount of thermal deformation in a film substrate varying with a distance from a central line of a film package.

EXPERIMENTAL EXAMPLE 2

The film package FP was fabricated to include the film substrate 110 including polyimide, the output and input pads 132 and 134 including copper, and the connection patterns 138 including copper (see FIG. 5). Before the semiconductor chip 120 is mounted, the film package FP was thermally compressed and then an amount of deformation in the film substrate 110 was measured along a distance from the central line CL. FIG. 9 shows results of the measured amount of deformation.

Afterwards, the film package FP having the semiconductor chip 120 mounted thereon was thermally compressed again, and then an amount of deformation in the film substrate 110 was measured along the distance from the central line CL. FIG. 9 shows results of the measured amount of deformation.

In FIG. 9, the amount of deformation in the film substrate 110 may mean a total amount of deformation in the film substrate 110 between the central line CL and a target point. Therefore, the graph may have a slope that indicates an amount of deformation per unit length of the film substrate 110. Referring to FIG. 9, before and after the coupling process, it may be found that an amount of deformation per unit length of the film substrate 110 on the chip region CR is greater than an amount of deformation per unit length of the film substrate 110 on the peripheral region PR. For example, when the chip region CR and the peripheral region PR have the same length before the coupling process, the length of the chip region CR after the coupling process may be greater than the length of the peripheral region PR after the peripheral region PR.

Because the slope of the graph is constant on the chip region CR, it may be ascertained that, on the chip region CR, the amount of deformation per unit length of the film substrate 110 is constant regardless of the distance from the central line CL. In addition, because the slope of the graph is constant on the peripheral region PR, it may be ascertained that, on the peripheral region PR, the amount of deformation per unit length of the film substrate 110 is constant regardless of the distance from the central line CL. This may be due to uniform use of materials having similar thermal expansion properties in the chip region CR and/or use of materials having similar thermal expansion properties in the peripheral region PR.

In designing the film package FP, pad layouts of the chip region CR and the peripheral region PR may be designed in consideration of the amount of deformation per unit length of the film substrate 110 at each of the chip and peripheral regions CR and PR. For example, when the panel pads 230 have a regular pitch, the output pads 132 on the chip region CR may be designed to have a pitch less than that of the output pads 132 on the peripheral region PR. Accordingly, it may be possible to prevent a misalignment caused by a difference in amount of deformation in the film substrate 110 at each of the chip and peripheral regions CR and PR.

Referring back to FIGS. 8 and 9, when the design of the film package FP is assigned with placement of the semiconductor chip 120 in the film package FP and the shrink factor at each of the chip and peripheral regions CR and PR, the panel pads 230 and the output pads 132 may be precisely aligned with each other in coupling the display device DD and the film package FP to each other.

Figure 10A:
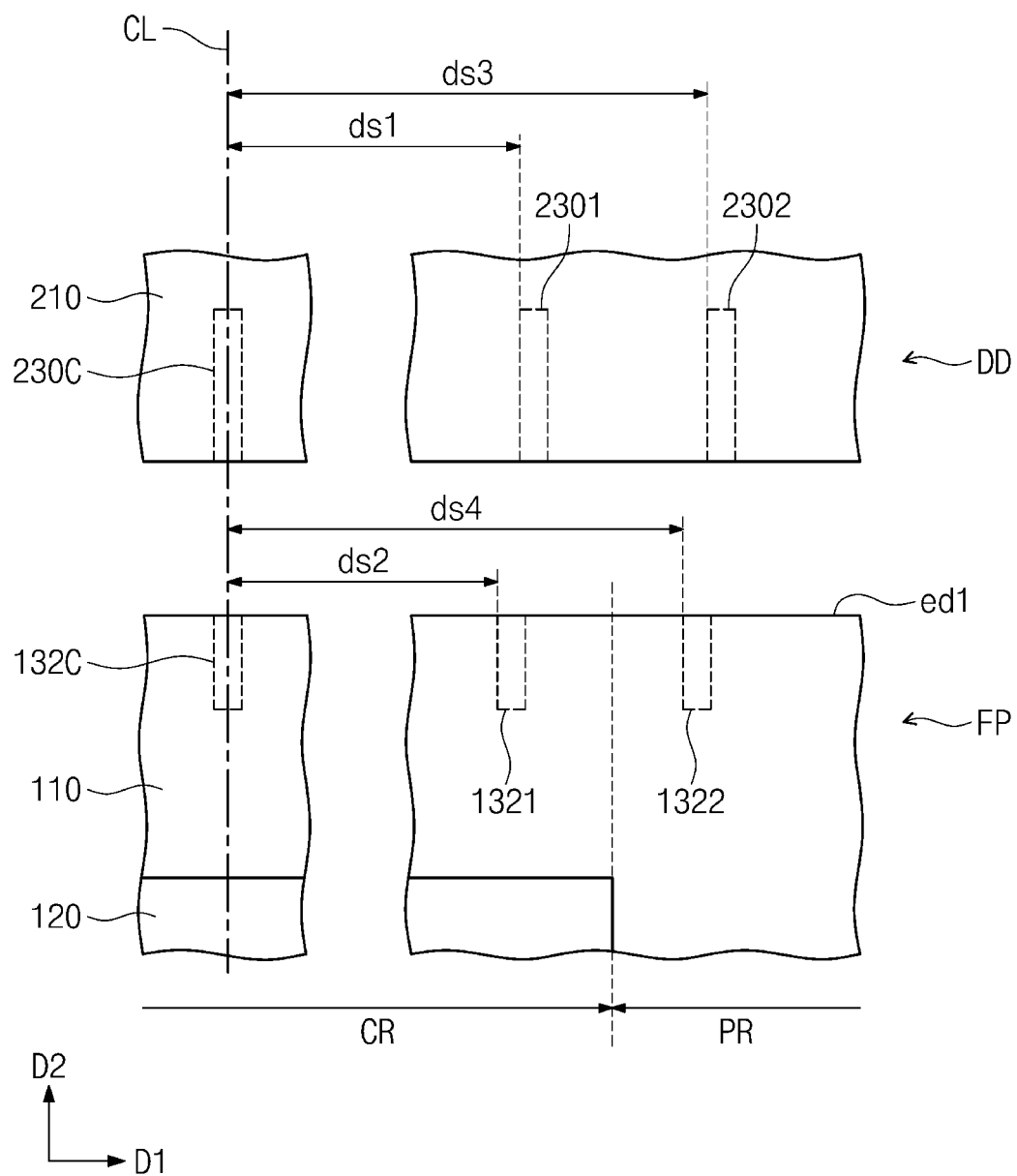
FIGS. 10A and 10B illustrate enlarged plan views partially showing a package module fabricated by some embodiments of the present inventive concepts.
Figure 10B:
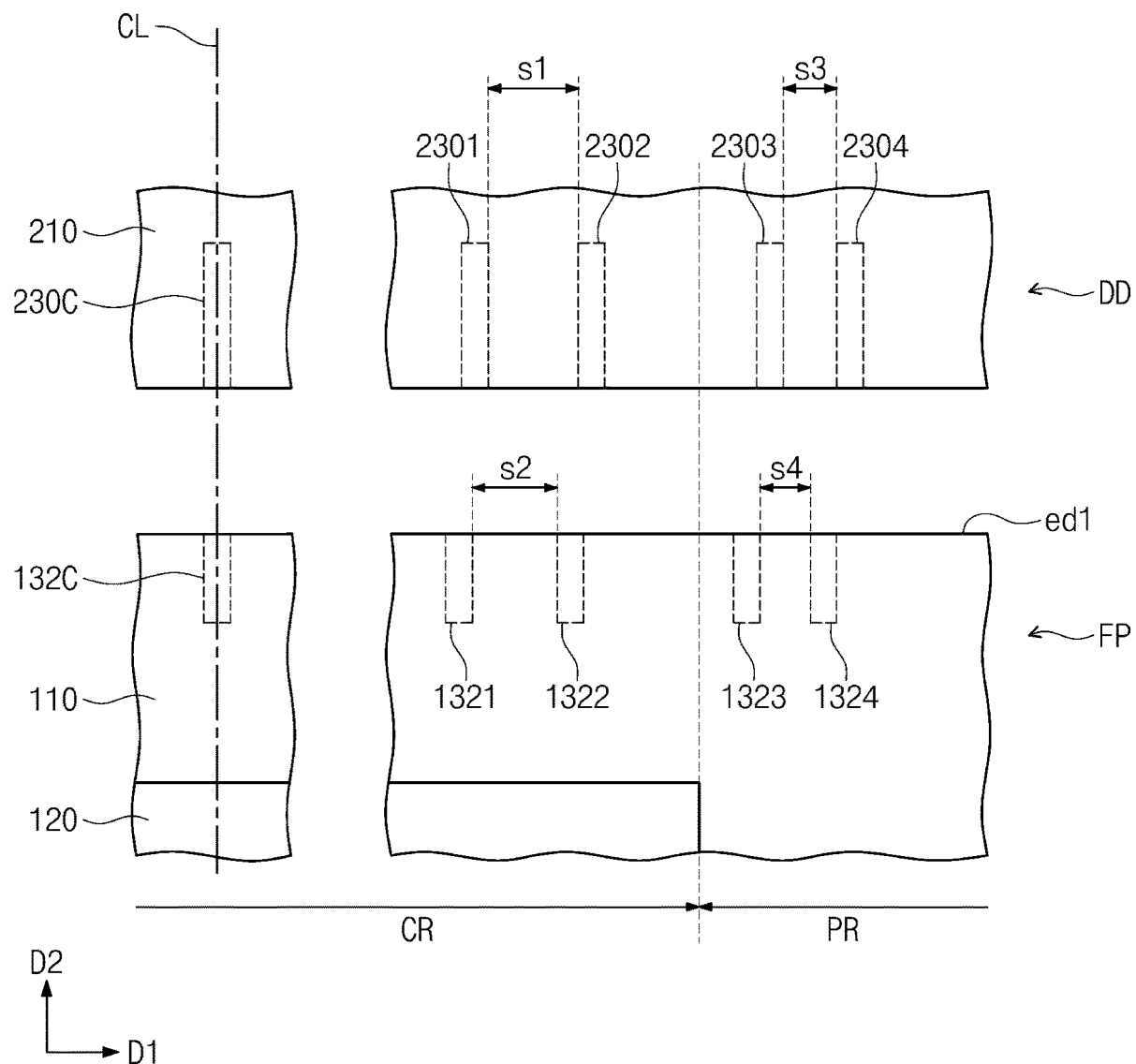

FIGS. 10A and 10B illustrate enlarged plan views partially showing a package module fabricated by some embodiments of the present inventive concepts. FIGS. 10A and 10B show panel pads and output pads before a coupling process is performed.

Referring to FIG. 10A, the display device DD may be provided which includes the first alignment pad 230C, a first panel pad 2301, and a second panel pad 2302. The first alignment pad 230C, the first panel pad 2301, and the second panel pad 2302 may be panel pads included in the same pad group among a plurality of pad groups formed on the non-display region (see NDR of FIG. 1) of the display device DD. The first alignment pad 230C may be a panel pad located on the central line CL that divides the pad group into two equal parts in the first direction D1. The first alignment pad 230C, the first panel pad 2301, and the second panel pad 2302 may be arranged along the first direction D1.

The film package FP may be provided which is coupled to and configured to transfer driving signals to the display device DD. The film package FP may have the first edge ed1 facing the display device DD. The film package FP may include the chip region CR on which the semiconductor chip 120 is disposed, and also include the peripheral region PR on which the semiconductor chip 120 is not disposed. The chip and peripheral region CR and PR may share the first edge ed1 and face each other in the first direction D1. For example, the chip and peripheral regions CR and PR may be arranged in the first direction D1.

The second alignment pad 132C and a first output pad 1321 may be disposed on the chip region CR. The second alignment pad 132C may be an output pad located on the central line CL that divides the film package FP into two equal parts in the first direction D1. The second alignment pad 132C and the first output pad 1321 may be disposed adjacent to the first edge ed1 and spaced apart from each other in the first direction D1.

A second output pad 1322 may be disposed on the peripheral region PR. The second output pad 1322 may be disposed adjacent to the first edge ed1 and spaced apart in the first direction D1 from the second alignment pad 132C and the first output pad 1321. A distance ds4 between the second output pad 1322 and a center (or the central line CL) in the first direction D1 of the second alignment pad 132C may be greater than a distance ds2 between the first output pad 1321 and the center of the second alignment pad 132C.

The second alignment pad 132C, the first output pad 1321, and the second output pad 1322 may be configured to have connection respectively with the first alignment pad 230C, the first panel pad 2301, and the second panel pad 2302 in a subsequent coupling process that couples the film package FP to the display device DD, such as described with respect to block S40 of FIG. 4. For example, the second alignment pad 132C may correspond to the first alignment pad 230C, the first output pad 1321 may correspond to the first panel pad 2301, and the second output pad 1322 may correspond to the second panel pad 2302. A difference in pitch between pads of the film package FP and pads of the display device DD before the coupling process may be corrected due to expansion of the film substrate 110 during the coupling process. For example, after the coupling process, the second alignment pad 132C may be aligned with the first alignment pad 230C, the first output pad 1321 may be aligned with the first panel pad 2301, and the second output pad 1322 may be aligned with the second panel pad 2302.

A first ratio, or ds2/ds1, may be given to a ratio of the distance ds2 between the second alignment pad 132C and the first output pad 1321 to the distance ds1 between the first alignment pad 230C and the first panel pad 2301. A second ratio, or ds4/ds3, may be given to a ratio of a distance ds4 between the second alignment pad 132C and the second output pad 1322 to a distance ds3 between the first alignment pad 230C and the second panel pad 2302. As discussed with reference to FIG. 6, when the display device DD and the film package FP are designed with different shrink factors assigned to the chip region CR and the peripheral region PR, such that the first ratio ds2/ds1 may be less than the second ratio ds4/ds3.

Referring to FIG. 10B, the display device DD may be provided which includes the first alignment pad 230C and first, second, third, and fourth panel pads 2301, 2302, 2303, and 2304. The first alignment pad 230C and the first to fourth panel pads 2301 to 2304 may be panel pads included in the same pad group among a plurality of pad groups formed on the non-display region (see NDR of FIG. 1) of the display device DD. The first alignment pad 230C may be a panel pad located on the central line CL that divides the pad group into two equal parts in the first direction D1. The first alignment pad 230C and the first to fourth panel pads 2301 to 2304 may be arranged along the first direction D1.

The film package FP may be provided which is coupled to and configured to transfer driving signals to the display device DD. The film package FP may have the first edge ed1 facing the display device DD. The film package FP may include the chip region CR on which the semiconductor chip 120 is disposed, and also include the peripheral region PR on which the semiconductor chip 120 is not disposed. The chip and peripheral region CR and PR may share the first edge ed1 and face each other in the first direction D1. For example, the chip and peripheral regions CR and PR may be arranged in the first direction D1.

The second alignment pad 132C, a first output pad 1321, and a second output pad 1322 may be disposed on the chip region CR. The second alignment pad 132C may be an output pad located on the central line CL that divides the film package FP into two equal parts in the first direction D1. The second alignment pad 132C, the first output pad 1321, and the second output pad 1322 may be disposed adjacent to the first edge ed1 and spaced apart from each other in the first direction D1.

A third output pad 1323 and a fourth output pad 1324 may be disposed on the peripheral region PR. The third output pad 1323 and the fourth output pad 1324 may be disposed adjacent to the first edge ed1 and spaced apart in the first direction D1 from the second alignment pad 132C.

The second alignment pad 132C and the first to fourth output pads 1321 to 1324 may be configured to have connection respectively with the first alignment pad 230C and the first to fourth panel pads 2301 to 2304 in a subsequent coupling process that couples the film package FP to the display device DD. A difference in pitch between pads of the film package FP and pads of the display device DD before the coupling process may be removed or reduced due to expansion of the film substrate 110 during the coupling process. For example, after the coupling process, the second alignment pad 132C may be substantially aligned with the first alignment pad 230C, and the first to third output pads 1321 to 1324 may be aligned with the first to fourth panel pads 2301 to 2304.

A first ratio, or s2/s1, may be given to a ratio of a distance s2 between the first and second output pads 1321 and 1322 to a distance s1 between the first and second panel pads 2301 and 2302, and a second ratio, or s4/s3, may be given to a ratio of a distance s4 between the third and fourth output pads 1323 and 1324 to a distance s3 between the third and fourth panel pads 2303 and 2304. As discussed with reference to FIG. 6, when the display device DD and the film package FP are designed with different shrink factors assigned to the chip region CR and the peripheral region PR, the first ratio s2/s1 may be less than the second ratio s4/s3.

Figure 11:
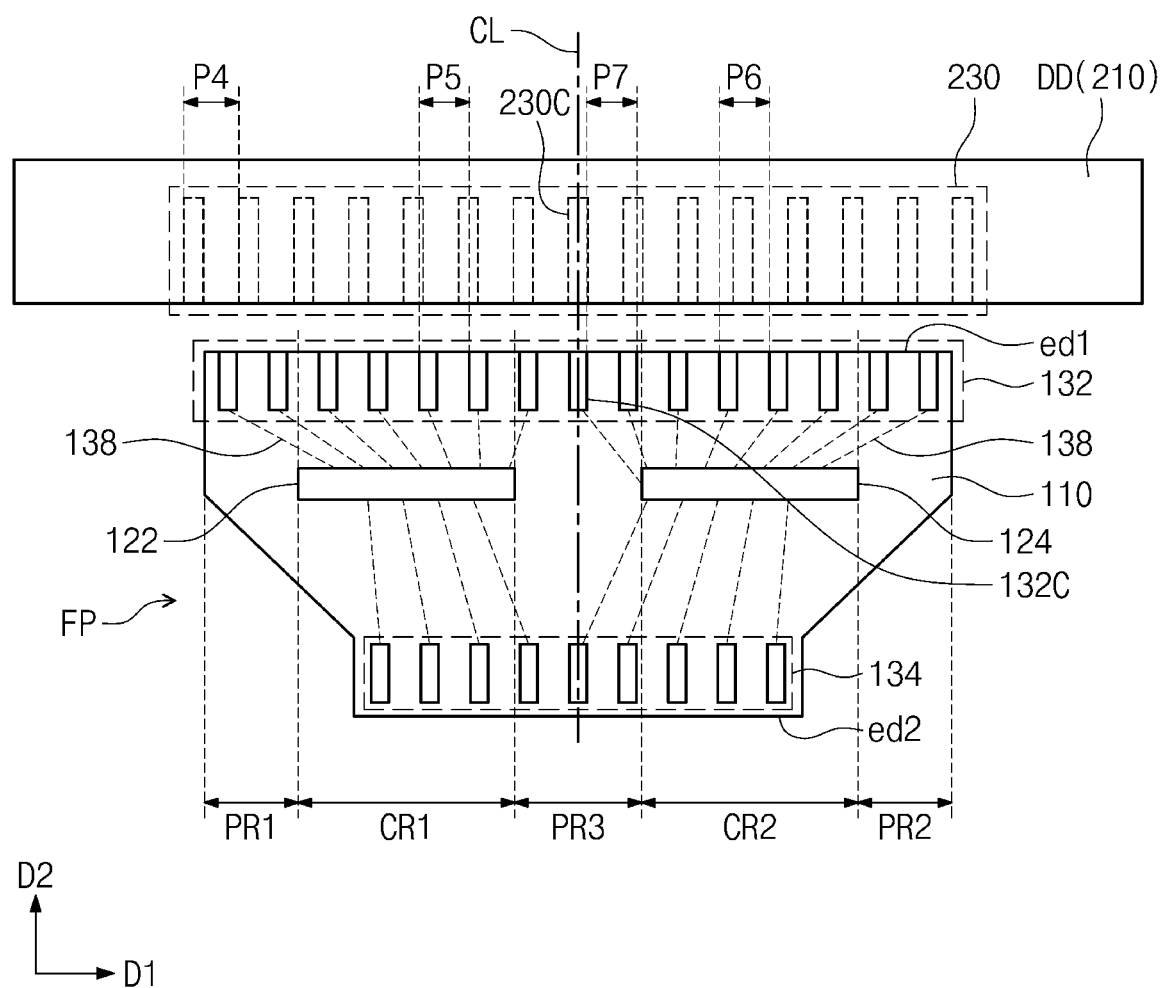
FIG. 11 illustrates a plan view showing a film package, according to some example embodiments of the present inventive concepts.

FIG. 11 illustrates a plan view showing a film package, according to some example embodiments of the present inventive concepts. Those parts of the following configuration the same as those discussed above will be omitted for brevity of description.

Referring to FIG. 11, the film package FP, according to some embodiments of the present inventive concepts, may include a plurality of semiconductor chips, for example, a first semiconductor chip 122 and a second semiconductor chip 124.

For example, the film package FP may include first and second peripheral regions PR1 and PR2 that are spaced apart from each other in the first direction D1, first and second chip regions CR1 and CR2 that are disposed between the first and second peripheral regions PR1 and PR2 and spaced apart from each other in the first direction D1, and a third peripheral region PR3 between the first and second chip regions CR1 and CR2. The first and second chip regions CR1 and CR2 may be areas on which the first and second semiconductor chips 122 and 124 are respectively disposed. The first, second, and third peripheral regions PR1, PR2, and PR3 may be areas on which no semiconductor chips are disposed.

The first and second semiconductor chips 122 and 124 may be spaced apart from each other in the first direction D1. The first semiconductor chip 122 may be electrically connected through the connection patterns 138 to at least one of the output pads 132 and at least one of the input pads 134. The second semiconductor chips 124 may be electrically connected through the connection patterns 138 to at least another of the output pads 132 and at least another of the input pads 134. For example, each of the first and second semiconductor chips 122 and 124 may have a width in the first direction D1 greater than a width in the second direction D2. The first and second semiconductor chips 122 and 124 may be equally spaced apart from the first edge ed1, with their lateral surfaces facing each other. For example, a distance between the first semiconductor chip 122 and the first edge ed1 may be the same as that between the second semiconductor chip 124 and the first edge ed1. The first and second semiconductor chips 122 and 124 may have the same length in the first direction D1. The distance between the first edge ed1 and either of the first and second semiconductor chips 122 and 124 may be less than half the length in the first direction D1 of each of the first and second semiconductor chips 122 and 124.

The panel pads 230 of the display device DD may be arranged at a fourth pitch P4. The output pads 132 on the first chip region CR1 may be arranged at a fifth pitch P5. The output pads 132 on the second chip region CR2 may be arranged at a sixth pitch P6. The fourth pitch P4 may be greater than the fifth and sixth pitches P5 and P6. When the panel pads 230 have a regular pitch, the output pads 132 on each of the first and second chip regions CR1 and CR2 may be arranged at a regular interval along the first direction D1. The fifth and sixth pitches P5 and P6 may be the same as each other.

The output pads 132 on each of the first to third peripheral regions PR1 to PR3 may be arranged at a seventh pitch P7. The output pads 132 on each of the first to third peripheral regions PR1 to PR3 may be arranged at a regular interval along the first direction D1.

The coupling process may cause the output pads 132 of the film package FP to have an increased pitch as discussed with reference to FIGS. 6 and 7. After the coupling process, the output pads 132 of the film package FP may have the same pitch as that of the panel pads 230 of the display device DD. In this case, an amount of increase in the fifth and sixth pitches P5 and P6 may be greater than an amount of increase in the seventh pitch P7.

Figure 12:
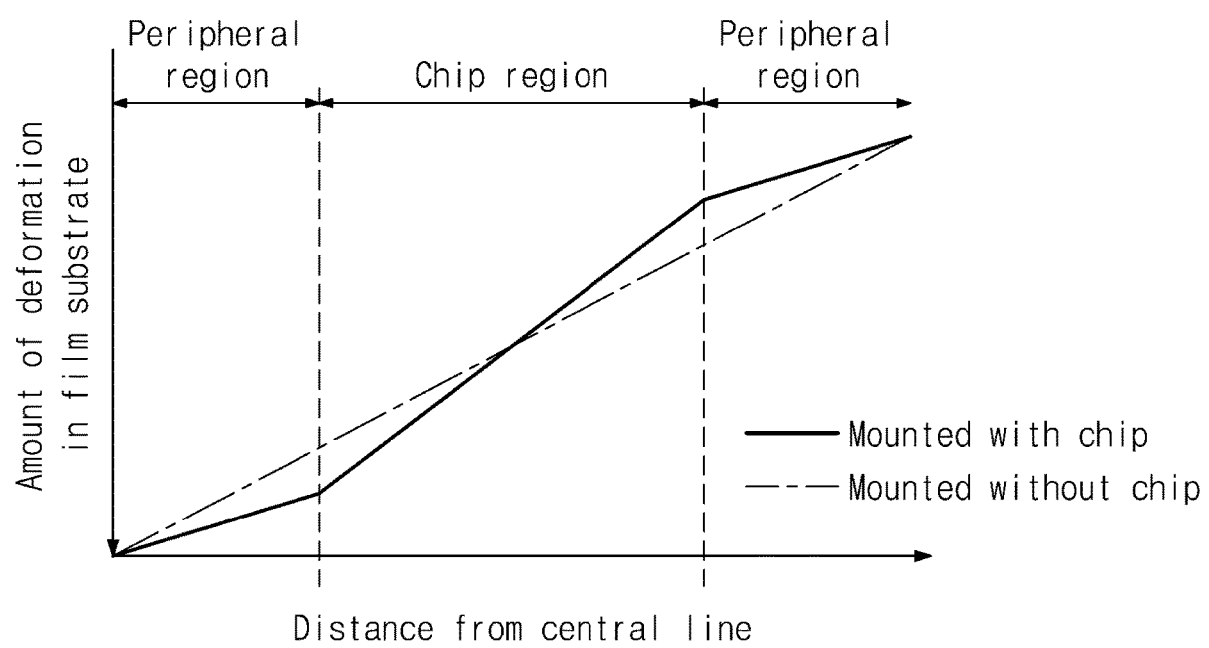
FIG. 12 illustrates a graph showing an amount of thermal deformation in a film substrate versus a distance from a central line of a film package of FIG. 11.

FIG. 12 illustrates a graph showing an amount of thermal deformation in a film substrate varying with a distance from a central line of a film package of FIG. 11.

EXPERIMENTAL EXAMPLE 3

The film package FP was fabricated which includes the film substrate 110 including polyimide, the output and input pads 132 and 134 including copper, and the connection patterns 138 including copper. Before a plurality of semiconductor chips 122 and 124 are mounted, the film package FP was thermally compressed and then an amount of deformation in the film substrate 110 was measured along a distance from the central line CL. FIG. 12 shows results of the measured amount of deformation. Afterwards, the film package FP having the semiconductor chips 122 and 124 mounted thereon was thermally compressed again, and then the amount of deformation in the film substrate 110 was measured along the distance from the central line CL. FIG. 12 shows results of the measured amount of deformation.

Referring to FIG. 12 together with FIG. 11, an amount of deformation per unit length of the film substrate 110 at each of the chip regions CR1 and CR2 may be greater that an amount of deformation per unit length of the film substrate 110 at each of the peripheral regions PR1, PR2, and PR3. In designing the film package FP, pad layouts of the chip regions CR1 and CR1 and the peripheral regions PR1, PR2, and PR3 may be designed in consideration of the amount of deformation per unit length of the film substrate 110 at each of the chip and peripheral regions CR1, CR2, PR1, PR2, and PR3. For example, when the panel pads 230 have a regular pitch, the output pads 132 on the chip regions CR1 and CR2 may be designed to have a pitch less than that of the output pads 132 on the peripheral regions PR1, PR2, and PR3. Accordingly, it may be possible to prevent a misalignment caused by a difference in amount of deformation in the film substrate 110 at each of the chip and peripheral regions CR1, CR2, PR1, PR2, and PR3.

According to the present inventive concepts, it may be possible to provide a film package in which a pad misalignment is prevented or reduced and reliability is improved.

Although some example embodiments of the present inventive concepts have been discussed with reference to accompanying figures, it will be understood that various changes in form and details may be made therein without departing from the scope of the present inventive concepts. It therefore will be understood that the embodiments described above are just illustrative but not limitative in all aspects.

What is claimed is:

1. A film package, comprising:
a film substrate comprising a chip region and a peripheral region facing each other in a first direction;
a plurality of output pads that are spaced apart from each other in the first direction on the chip region and on the peripheral region; and
a semiconductor chip on the chip region and electrically connected to the output pads,
wherein the output pads on the chip region are at regular first intervals along the first direction, and
wherein the output pads comprise:
a plurality of first output pads that are spaced apart from the semiconductor chip in a second direction perpendicular to the first direction and are at a first pitch along the first direction on the chip region of the film substrate; and
a plurality of second output pads on the peripheral region of the film substrate, wherein the second output pads are at a second pitch that is greater than the first pitch of the first output pads.

2. The film package of claim 1,
wherein the chip region is defined by lateral surfaces of the semiconductor chip that are opposite each other in the first direction; and
wherein the plurality of first output pads are on the chip region between the lateral surfaces of the semiconductor chip.

3. The film package of claim 1,
wherein, in plan view, the plurality of second output pads are spaced apart in the first direction from the semiconductor chip, and
wherein the first output pads overlap the semiconductor chip in the first direction.

4. The film package of claim 1,
wherein the film substrate comprises a first edge that is adjacent to the plurality of first output pads and the plurality of second output pads,
wherein a distance in the second direction between the semiconductor chip and the first edge is less than half a length in the first direction of the semiconductor chip.

5. The film package of claim 1, wherein the second output pads on the peripheral region are at regular second intervals along the first direction.

6. The film package of claim 1,
wherein the semiconductor chip has a length in the first direction greater than a width in the second direction of the semiconductor chip.

7. The film package of claim 1, further comprising:
a plurality of input pads that are spaced apart from each other in the first direction and electrically connected to the semiconductor chip,
wherein the plurality of output pads are adjacent to a first edge of the film substrate having a first edge length;
wherein the plurality of input pads are adjacent to a second edge of the film substrate, the second edge being spaced apart from, and parallel to, the first edge, and having a second edge length that is less than the first edge length in the first direction; and
wherein the semiconductor chip is between the output pads and the input pads.

8. The film package of claim 1, wherein the chip region comprises a first chip region, and wherein the semiconductor chip comprises a first semiconductor chip, further comprising:
a second chip region, wherein the peripheral region is between the first and second chip regions, and wherein the first and second chip regions are spaced apart from each other in the first direction; and
a second semiconductor chip on the second chip region and electrically connected to at least one of the output pads,
wherein the output pads comprise:
a plurality of third output pads on the peripheral region, wherein the third output pads are at a third pitch greater than the first pitch of the first output pads and greater than the second pitch of the second output pads.

9. The film package of claim 8,
wherein the film substrate has a first edge adjacent to the output pads,
wherein a distance in the second direction between the first semiconductor chip and the first edge is equal to a distance in the second direction between the second semiconductor chip and the first edge.

10. The film package of claim 8, wherein, in a plan view, the plurality of second output pads are spaced apart from the first semiconductor chip in the first direction and in the second direction.

11. The film package of claim 8,
wherein each of the first and second semiconductor chips has a length in the first direction greater than a width in the second direction of the each of the first and second semiconductor chips.

12. The film package of claim 8,
wherein a first shrink factor of the first and second chip regions is different from a second shrink factor of the peripheral region.

13. A package module, comprising:
a display device;
a film substrate comprising a chip region and a peripheral region adjacent each other;

a first plurality of output pads on the chip region of the film substrate that are spaced apart at first intervals in a first direction, a second plurality of output pads on the peripheral region of the film substrate that are spaced apart at second intervals different from the first intervals in the first direction; and a semiconductor chip on the chip region that is electrically connected to the first plurality of output pads and the second plurality of output pads, wherein the film substrate comprises a first material and the display device comprises a substrate comprising a second material, wherein a first thermal expansion coefficient of the first material is greater than a second thermal expansion coefficient of the second material; and wherein both the first plurality of output pads spaced apart at first intervals on the chip region of the film substrate and the second plurality of output pads spaced apart at second intervals different from the first intervals on the peripheral region of the film substrate are offset from the semiconductor chip in a second direction perpendicular to the first direction.

14. The package module of claim 13, wherein the first plurality of output pads on the chip region are spaced apart from one another at a first pitch, wherein the second plurality of output pads on the peripheral region are spaced apart from one another at a second pitch; and wherein the second pitch is greater than the first pitch.

15. The package module of claim 13, wherein the first plurality of output pads and the second plurality of output pads are in a first direction that is along a lengthwise direction of the semiconductor chip.

16. The package module of claim 15, wherein, in a plan view, the second plurality of output pads are spaced apart from the semiconductor chip in the first direction and in a second direction that is perpendicular to the first direction.

17. The package module of claim 16, wherein the first plurality of output pads are spaced apart from the semiconductor chip in the second direction and overlap the semiconductor chip in the first direction.

18. The package module of claim 13, wherein the first plurality of output pads are spaced apart at the first intervals in a first direction, wherein the second plurality of output pads are spaced apart at the second intervals in the first direction, and wherein the second intervals are greater than the first intervals.

19. The package module of claim 13, wherein a first shrink factor of the chip region is different from a second shrink factor of the peripheral region.

* * * * *